(12) United States Patent
McClure et al.

(10) Patent No.: US 9,417,661 B2
(45) Date of Patent: Aug. 16, 2016

(54) DISPLAY MODULE

(71) Applicant: Apple Inc., Cupertino, CA (US)

(72) Inventors: Stephen R. McClure, San Francisco, CA (US); Joshua D. Banko, Palo Alto, CA (US); Jonathan Ternus, Redwood City, CA (US); Matthew B. Morris, Alapaha, CA (US); Peter M. Thompson, San Jose, CA (US); Kevin Gibbs, San Carlos, CA (US); Timothy G. Van Vorhis, Elk Grove, CA (US); Martin B. Adamcyk, Belmont, CA (US); Arthur J. Lucchesi, San Jose, CA (US); Brian Scott Carpenter, Livermore, CA (US)

(73) Assignee: Apple Inc., Cupertino, CA (US)

(*) Notice: Subject to any disclaimer, the term of this patent is extended or adjusted under 35 U.S.C. 154(b) by 74 days.

(21) Appl. No.: 14/630,434

(22) Filed: Feb. 24, 2015

(65) Prior Publication Data

US 2015/0169004 A1 Jun. 18, 2015

Related U.S. Application Data

(63) Continuation of application No. 13/541,614, filed on Jul. 3, 2012, now Pat. No. 8,971,028, which is a continuation of application No. 12/964,168, filed on Dec. 9, 2010, now Pat. No. 8,509,036.

(60) Provisional application No. 61/292,739, filed on Jan. 6, 2010.

(51) Int. Cl.
*G06F 1/16* (2006.01)
*H05K 1/02* (2006.01)
(Continued)

(52) U.S. Cl.
CPC ............ *G06F 1/1637* (2013.01); *G06F 1/1613* (2013.01); *G06F 1/1626* (2013.01);
(Continued)

(58) Field of Classification Search
CPC .................... G06F 1/1643; G02F 1/133308
USPC .......... 349/15, 58, 60, 62; 345/173, 174, 104, 345/207, 690, 7, 204, 169, 694, 1.3, 175, 345/636, 156; 206/545; 248/917, 346.5, 248/919, 231.91, 178.1; 312/7.2, 223.2, 312/223.1; 361/679.21, 679.01, 679.02, 361/679.27, 679.06, 679.26, 679.22, 361/679.05, 679.57
See application file for complete search history.

(56) References Cited

U.S. PATENT DOCUMENTS 5,248,960 A 9/1993 Hamma
5,266,746 A 11/1993 Nishihara et al.
(Continued)

FOREIGN PATENT DOCUMENTS

CN 1388705 1/2003
CN 1448834 10/2003
(Continued)

OTHER PUBLICATIONS

Design Guidelines for Flexible Circuits, Electronic Packaging & Production, No. 8, Aug. 1988, Newton, MA.
(Continued)

*Primary Examiner* — Hung Duong
(74) *Attorney, Agent, or Firm* — Joseph F. Guihan

(57) ABSTRACT

A portable computing device is disclosed. The portable computing device can take many forms such as a laptop computer, a tablet computer, and so on. The portable computing device can include a single piece housing and a display module. The display module can include a protective top glass cover that is bonded to a plastic display frame and surrounded by a seal frame. The display module can also include a display panel and its associated circuitry suspended from the display frame below the protective glass cover. The display module is coupled to the single piece housing using mounting clips in a manner that allows the display module to move relative to the single piece housing during an impact event. The plastic display frame can include inserts that provide structural support near openings in the single piece housing.

20 Claims, 9 Drawing Sheets

(51) Int. Cl.
  *H05K 1/11* (2006.01)
  *G06F 1/18* (2006.01)
  *H04M 1/02* (2006.01)
  *H05K 1/14* (2006.01)

(52) U.S. Cl.
  CPC ............ *G06F1/1643* (2013.01); *G06F 1/1656* (2013.01); *G06F 1/182* (2013.01); *H04M 1/0266* (2013.01); *H04M 1/0277* (2013.01); *H05K 1/0281* (2013.01); *H05K 1/118* (2013.01); *H04M 1/0252* (2013.01); *H05K 1/147* (2013.01); *Y10S 248/917* (2013.01); *Y10T 29/49004* (2015.01); *Y10T 29/49826* (2015.01); *Y10T 292/1076* (2015.04)

(56) References Cited

U.S. PATENT DOCUMENTS

| | | |
|---|---|---|
| 6,356,313 B1 | 3/2002 | Champion et al. |
| 6,771,490 B2 | 8/2004 | Peker et al. |
| 6,996,424 B2 | 2/2006 | Ijas et al. |
| 7,515,431 B1 | 4/2009 | Zadesky et al. |
| 7,995,334 B2 | 8/2011 | McClure et al. |
| 8,213,168 B2 * | 7/2012 | McClure ...................... 206/545 |
| 8,238,087 B2 | 8/2012 | McClure et al. |
| 8,345,410 B2 | 1/2013 | Ternus et al. |
| 8,432,678 B2 | 4/2013 | McClure et al. |
| 8,971,028 B2 * | 3/2015 | McClure ............... G06F 1/1613 248/917 |
| 2001/0015005 A1 | 8/2001 | Chung et al. |
| 2002/0059712 A1 | 5/2002 | Chem |
| 2003/0027589 A1 | 2/2003 | Wennemer et al. |
| 2003/0084859 A1 | 5/2003 | Glovatsky et al. |
| 2003/0127245 A1 | 7/2003 | Kusaka |
| 2005/0212991 A1 | 9/2005 | Sugawara |
| 2005/0225449 A1 | 10/2005 | Blakeway |
| 2005/0285991 A1 | 12/2005 | Yamazaki |
| 2006/0067066 A1 | 3/2006 | Meier et al. |
| 2006/0120035 A1 | 6/2006 | Merz et al. |
| 2006/0193109 A1 | 8/2006 | Bander et al. |
| 2006/0285302 A1 | 12/2006 | Kim |
| 2007/0111598 A1 | 5/2007 | Quilici |
| 2007/0121026 A1 | 5/2007 | Chang et al. |
| 2007/0229475 A1 | 10/2007 | Gettemy et al. |
| 2007/0254502 A1 | 11/2007 | Horikiri |
| 2008/0055828 A1 | 3/2008 | Yang |
| 2008/0165485 A1 | 7/2008 | Zadesky et al. |
| 2009/0067141 A1 | 3/2009 | Dabov et al. |
| 2009/0126450 A1 | 5/2009 | Su |
| 2009/0195974 A1 | 8/2009 | Rambosek et al. |
| 2009/0257189 A1 | 10/2009 | Wang et al. |
| 2009/0257207 A1 | 10/2009 | Wang et al. |
| 2009/0264160 A1 | 10/2009 | Mochizuki et al. |
| 2010/0061040 A1 | 3/2010 | Dabov et al. |
| 2010/0157522 A1 | 6/2010 | Refai-Ahmed |
| 2010/0265179 A1 | 10/2010 | Ram |
| 2011/0090627 A1 | 4/2011 | Raff et al. |
| 2011/0164365 A1 | 7/2011 | McClure et al. |
| 2011/0164372 A1 | 7/2011 | McClure et al. |
| 2011/0260993 A1 * | 10/2011 | Liu ....................... G06F 1/1643 345/173 |
| 2012/0176555 A1 | 7/2012 | Kasai |
| 2012/0281158 A1 * | 11/2012 | Chen ................ G02F 1/133308 349/15 |

FOREIGN PATENT DOCUMENTS

| | | |
|---|---|---|
| CN | 1467544 | 1/2004 |
| CN | 1482796 | 3/2004 |
| CN | 1989474 | 6/2007 |
| CN | 2938613 | 8/2007 |
| CN | 201181435 | 1/2009 |
| CN | 101458365 | 6/2009 |
| CN | 201298192 | 8/2009 |
| EP | 0090921 | 2/1983 |
| EP | 1501340 | 1/2005 |
| EP | 1791218 | 5/2007 |
| EP | 1884870 | 2/2008 |
| JP | 02170494 | 7/1990 |
| JP | 06112622 | 4/1994 |
| JP | H09115378 | 5/1997 |
| JP | 2001021869 | 1/2001 |
| JP | 2001263316 | 9/2001 |
| JP | 2001305985 | 11/2001 |
| JP | 2002330199 | 11/2002 |
| JP | 2003273476 | 9/2003 |
| JP | 2005032752 | 2/2005 |
| JP | 2007067243 | 3/2007 |
| JP | 2008158432 | 10/2008 |
| WO | 2008050408 | 5/2008 |
| WO | 2008085949 | 7/2008 |
| WO | 2008150052 | 12/2008 |
| WO | 2011084184 | 7/2011 |

OTHER PUBLICATIONS

Partial Search Report dated Dec. 14, 2010 in PCT Application No. PCT/US2010/046928.
Partial Search Report dated Dec. 1, 2010 in PCT Application No. PCT/US2010/046857.
International Search Report dated Dec. 3, 2010 in PCT Application No. PCT/US2010/047270.
Written Opinion dated Dec. 3, 2010 in PCT Application No. PCT/US2010/047270.
International Search Report dated Dec. 23, 2010 in PCT Application No. PCT/US2010/047272.
Written Opinion dated Dec. 23, 2010 in PCT Application No. PCT/US2010/047272.
Partial Search Report dated Dec. 2, 2010 in PCT Application No. PCT/US2010/046939.
Notice of Allowance dated Mar. 2, 2012 for U.S. Appl. No. 12/694,162.
Notice of Allowance dated Jan. 11, 2012 for U.S. Appl. No. 13/117,016.
Office Action dated Oct. 24, 2011 for U.S. Appl. No. 13/117,016.
Office Action dated Feb. 6, 2012 for U.S. Appl. No. 12/694,085.
Search Report dated Dec. 2, 2011 for Chinese Utility Model Patent No. ZL201020688636.7.
Written Opinion dated Feb. 2, 2012 in PCT Application No. PCT/US2010/046857.
Evaluation Report for Utility Model ZL2010206886282 dated Apr. 1, 2012.
Notification of the First Office Action for CN 201010613188.9 dated May 2, 2012.

* cited by examiner

DISPLAY MODULE

CROSS REFERENCE TO RELATED APPLICATIONS

This application is a continuation of patent application Ser. No. 13/541,614, filed Jul. 3, 2012, which is a continuation of patent application Ser. No. 12/694,168, filed Jan. 26, 2010, now U.S. Pat. No. 8,238,087, which claims the benefit of provisional patent application No. 61/292,739, filed Jan. 6, 2010, all of which are hereby incorporated by reference herein in their entireties. This application claims the benefit of and claims priority to patent application Ser. No. 13/541,614, filed Jul. 3, 2012, patent application Ser. No. 12/694,168, filed Jan. 26, 2010, now U.S. Pat. No. 8,238,087, issued Aug. 7, 2012, and provisional patent application No. 61/292,739, filed Jan. 6, 2010.

This patent application is related to and incorporates by reference in their entirety the following co-pending patent applications:

(i) U.S. patent application Ser. No. 12/694,085 entitled "HAND HELD COMPUTING DEVICE" by Ternus et al. filed Jan. 26, 2010;

(ii) U.S. patent application Ser. No. 12/694,200 entitled "COMPONENT ASSEMBLY" by McClure et al. filed Jan. 26, 2010;

(iii) U.S. patent application Ser. No. 12/694,162 ) entitled "ASSEMBLY OF DISPLAY MODULE" by McClure et al. filed Jan. 26, 2010; and (iii) U.S. patent application Ser. No. 12/694,166 entitled "PRINTED CIRCUIT BOARD" by McClure et al. filed Jan. 26, 2010; and (iv) U.S. patent application Ser. No. 12/694,083 entitled "EDGE BREAK DETAILS AND PROCESSING" by Sweet et. al. filed Jan. 26, 2010 that is, in turn, a continuation in part of and claims priority to U.S. patent application Ser. No. 12/580,934 entitled "METHOD AND APPARATUS FOR POLISHING A CURVED EDGE" by Lancaster et al filed Oct. 16, 2009 that takes priority under 35 U.S.C. 119(e) to U.S. Provisional Patent Application Ser. No. 61/249,200 entitled "COMPLEX GEOGRAPHICAL EDGE POLISHING" by Johannessen filed Oct. 6, 2009.

BACKGROUND

1. Field of the Described Embodiments

The described embodiments relate generally to portable computing devices such as laptop computers, tablet computers, and the like. More particularly, enclosures of portable computing devices and methods of assembling portable computing devices are described.

2. Description of the Related Art

In recent years, portable computing devices such as laptops, PDAs, media players, cellular phones, etc., have become small, light and powerful. One factor contributing to this reduction in size can be attributed to the manufacturer's ability to fabricate various components of these devices in smaller and smaller sizes while in most cases increasing the power and or operating speed of such components. The trend of smaller, lighter and powerful presents a continuing design challenge in the design of some components of the portable computing devices.

One design challenge associated with the portable computing device is the design of the enclosures used to house the various internal components. This design challenge generally arises from a number conflicting design goals that includes the desirability of making the enclosure lighter and thinner, the desirability of making the enclosure stronger and making the enclosure more esthetically pleasing. The lighter enclosures, which typically use thinner plastic structures and fewer fasteners, tend to be more flexible and therefore they have a greater propensity to buckle and bow when used while the stronger and more rigid enclosures, which typically use thicker plastic structures and more fasteners, tend to be thicker and carry more weight. Unfortunately, however, the increased weight consistent with the more rugged enclosure can lead to user dissatisfaction whereas bowing of enclosures formed of lightweight material can result in damaging some of the internal components (such as printed circuit boards) of the portable device.

Furthermore, the enclosures are mechanical assemblies having multiple parts that are screwed, bolted, riveted, or otherwise fastened together at discrete points. These assembly techniques typically complicate the housing design and create aesthetic difficulties because of undesirable cracks, seams, gaps or breaks at the mating surfaces and fasteners located along the surfaces of the housing. For example, a mating line surrounding the entire enclosure is produced when using an upper and lower casing. Moreover, the various components and complicated processes used to manufacture the portable device can make assembly a time consuming and cumbersome process requiring, for example, a highly trained assembly operator working with special tools.

Another challenge is related to techniques for mounting structures within the portable computing devices. Conventionally, the structures have been laid over one of the casings (upper or lower) and attached to one of the casings with fasteners such as screws, bolts, rivets, etc. That is, the structures are positioned in a sandwich like manner in layers over the casing and thereafter fastened to the casing. This methodology suffers from the same drawbacks as mentioned above, i.e., assembly is a time consuming and cumbersome process.

In view of the foregoing, there is a need for improved component density and associated assembly techniques that reduce cost and improve outgoing quality. In addition, there is a need for improvements in the manner in which handheld devices are assembled such as improvements that enable structures to be quickly and easily installed within the enclosure. It is also desirable to minimize the Z stack height of the assembled components in order to reduce the overall thickness of the portable computing device and thereby improve the overall aesthetic look and feel of the product.

SUMMARY OF THE DESCRIBED EMBODIMENTS

A portable computing device is disclosed. The portable computing device can include at least a single piece housing having a front opening, the single piece housing further comprising an integral bottom and side walls that cooperate to form a cavity in cooperation with the front opening, an edge of the side walls surrounding and defining the front opening, a display module disposed within the front opening and secured to the seamless housing without a bezel. In the described embodiment, the display module can include at least a display frame, a display panel supported by the display frame, a protective cover supported by the display frame used to protect the display panel, and a plurality of attachment features incorporated into the display frame, wherein the plurality of attachment features secure the display module to the housing when the portable computing device is deemed to be adequately functional.

In particular embodiments, the display module can include a protective glass cover bonded to display frame and surrounded by a seal that is coupled to the display frame. The display module can include a touch screen mounted below the protective glass cover. Further, a display panel housing including a display panel and its associated circuitry can be mounted to the display frame such that the display panel is visible through the protective glass cover.

In other embodiments, a method is described. The method can be carried out by performing at least the following operations. Electrically connecting a display module configured for use in a portable computing device to at least one operational component located within a cavity formed by a housing of the portable computing device, temporarily securing the display module to a front opening that provides access to the cavity, the temporarily secured display module effectively enclosing the at least one operational component within the housing, functionally testing the portable computing device; and if the portable computing device passes the functional testing, then securing the display module to the housing, otherwise, removing the display panel.

A method of assembling a display module to a portable computing device without using a bezel is disclosed. In the described embodiment, the portable computing device has a single piece housing, the single piece housing having a front opening, an integral bottom and side walls that cooperate to form a cavity in cooperation with the front opening, and an edge of the side walls surrounding and defining the front opening. The method can be carried out by performing at least the following: placing the display module within the front opening and secured to the seamless housing, and deploying an attachment feature, the attachment feature being incorporated into the display module.

BRIEF DESCRIPTION OF THE DRAWINGS

The embodiments will be readily understood by the following detailed description in conjunction with the accompanying drawings, wherein like reference numerals designate like structural elements, and in which.

DESCRIBED EMBODIMENTS

Figure 1A:
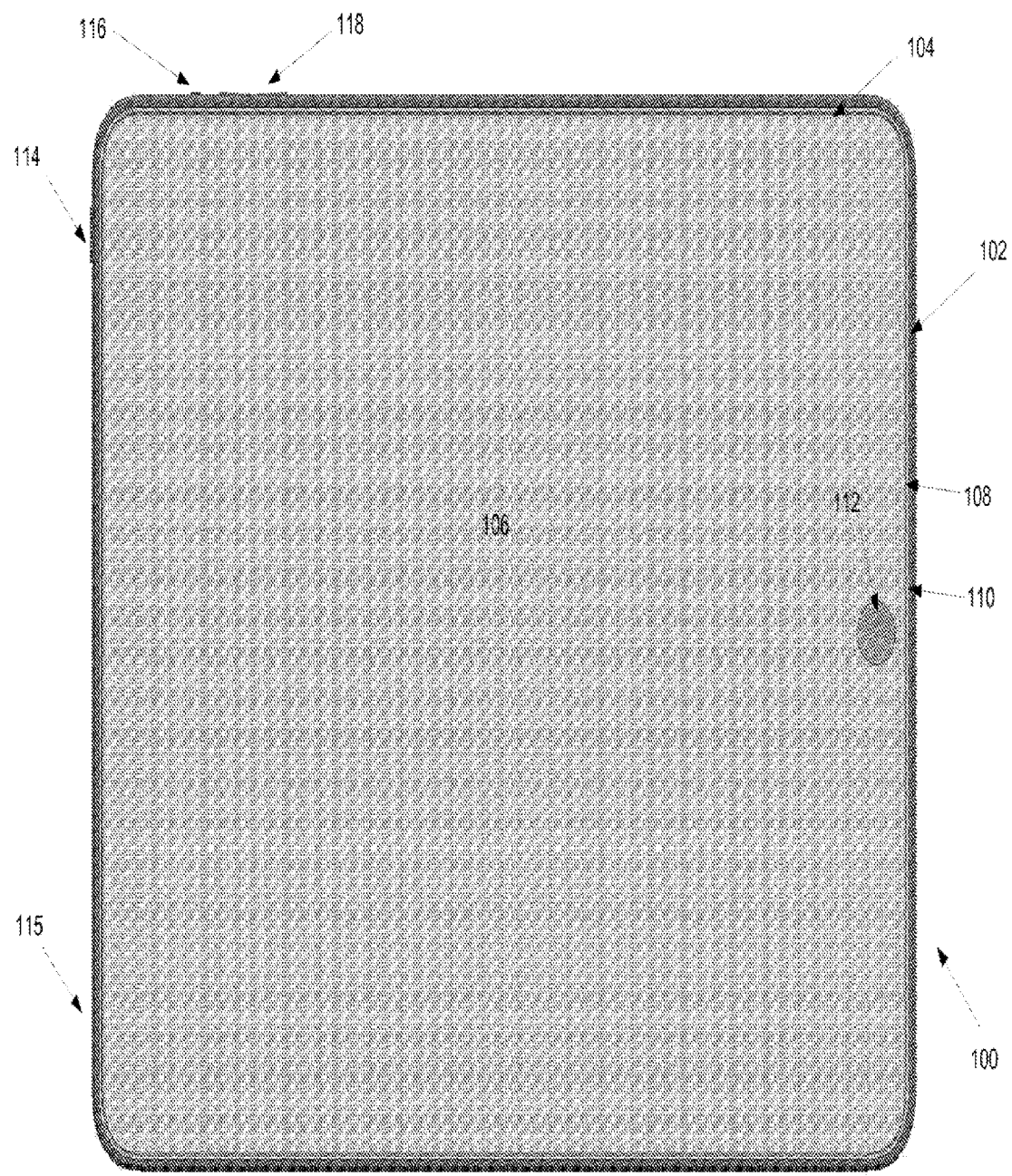
FIG. 1A shows a top view of a portable computing device in accordance with the described embodiments.

In the following paper, numerous specific details are set forth to provide a thorough understanding of the concepts underlying the described embodiments. It will be apparent, however, to one skilled in the art that the described embodiments may be practiced without some or all of these specific details. In other instances, well known process steps have not been described in detail in order to avoid unnecessarily obscuring the underlying concepts.

This paper discusses an aesthetically pleasing portable computing device that is easy to carry with one hand and operate with the other. The portable computing device can be formed of a single piece seamless housing and an aesthetically pleasing protective top layer that can be formed of any of a number of durable and strong yet transparent materials such as highly polished glass or plastic. For the remainder of this discussion, however, the protective top layer can take the form of highly polished cover glass without any loss in generality. Furthermore, the uniformity of the appearance of the portable computing device can be enhanced since (unlike conventional portable computing devices) the cover glass can be mounted to the single piece seamless housing without the use of a bezel. This simplicity of design can accrue many advantages to the portable computing device besides those related to aesthetic look and feel. For example, fewer components and less time and effort can be required for assembly of the portable computing device, and the absence of seams in the single piece housing can provide good protection against environmental contamination of internal components. Moreover, the ability of the portable computing device to successfully withstand applied loads (such as from day to day use) as well as those from less frequent but potentially more damaging events such as being dropped can be substantially improved over conventional portable computing devices.

In the described embodiments, the single piece seamless housing can be formed from plastic or metal. In the case where the single piece seamless housing is formed of metal, the metal can take the form of a single sheet (such as aluminum). The single sheet of metal can be formed into a shape appropriate for housing various internal components as well as providing various openings into which switches, connectors, displays, and so on can be accommodated. The single piece seamless housing can be forged, molded, or otherwise processed into a desired shape. The shape of the housing can be asymmetric in that an upper portion of the housing can be formed to have a substantially different shape than that exhibited by a lower portion of the housing. For example, the upper portion of the housing can have surfaces that meet at distinct angles forming well defined boundary whereas the lower portion can be formed to have a surface with a spline shape. The transition zone between the upper portion having distinct edges and the lower, spline shaped portion can take the form of an edge having a rounded shape providing both a natural change from the upper portion of the housing (i.e., the area of distinct edges) and the smoother surface presented by the lower portion of the housing. It should also be noted that in addition to providing a more aesthetically pleasing transition, the rounded shape of the edge in the transition zone can provide a more comfortable feel when being held in a user's hand either during use or merely being carried about. One of the advantages to using metal for the housing is ability of metal to provide good electrical grounding for any internal components requiring a good ground plane. For example, performance of a built in RF antenna can be substantially improved when a good ground plane is provided. Moreover, a good ground plane can be used to help mitigate the deleterious effects caused by, for example, of electromagnetic interference (EMI) and/or electrostatic discharge (ESD).

It should be noted that throughout the following discussion, the term "CNC" is used. The abbreviation CNC stands for computer numerical control and refers specifically to a computer controller that reads computer instructions and drives a machine tool (a powered mechanical device typically used to fabricate components by the selective removal of material). It should be noted however, that any appropriate machining operation can be used to implement the described embodiments and is not strictly limited to those practices associated with CNC.

Figure 7A:
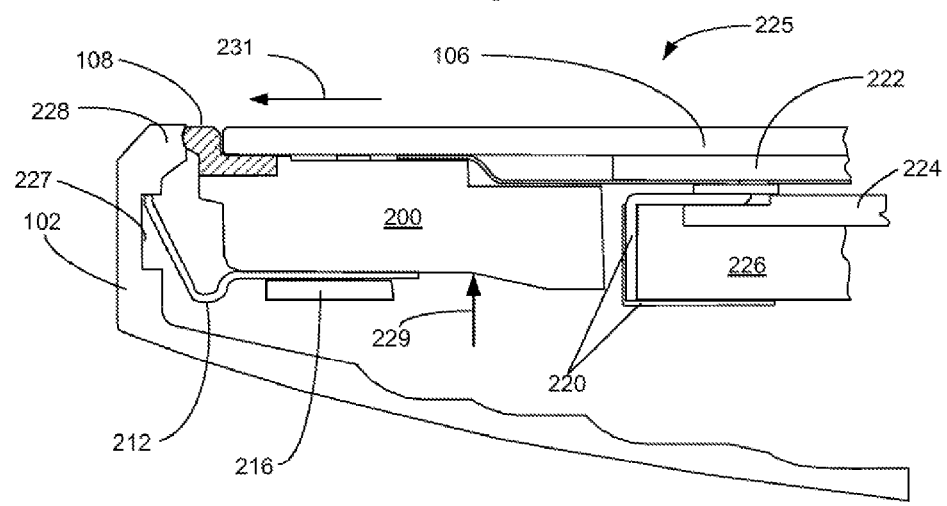
FIG. 7A shows a cross sectional view of a portable computing device with the display frame and display panel in an assembled position in accordance with the described embodiments.
Figure 7B:
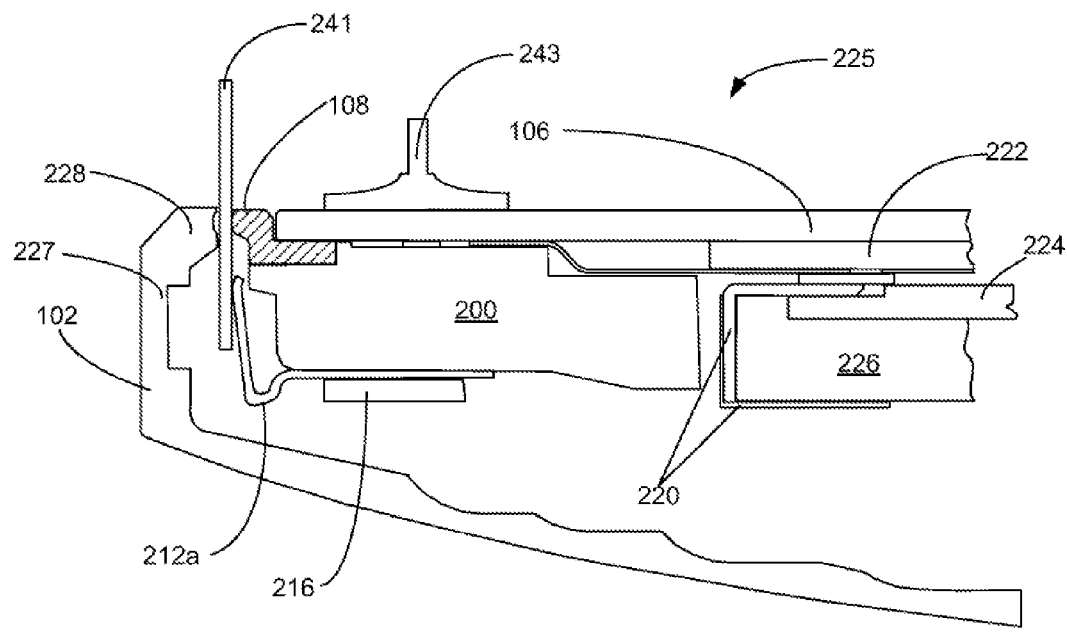
FIG. 7B shows a cross sectional view of a portable computing device with a display module in a pre-assembled position in accordance with the described embodiments.
Figure 8:
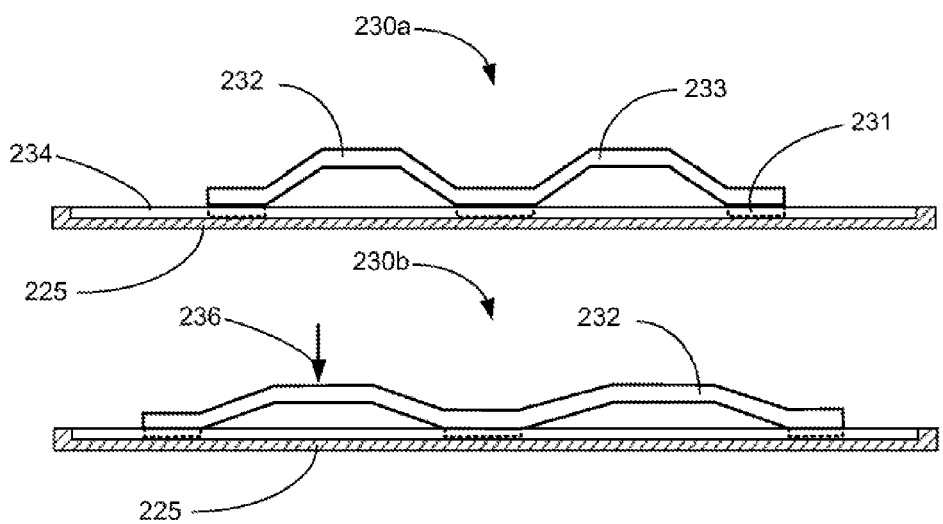
FIG. 8 shows side views of a mounting mechanism in accordance with the described embodiments.
Figure 9:
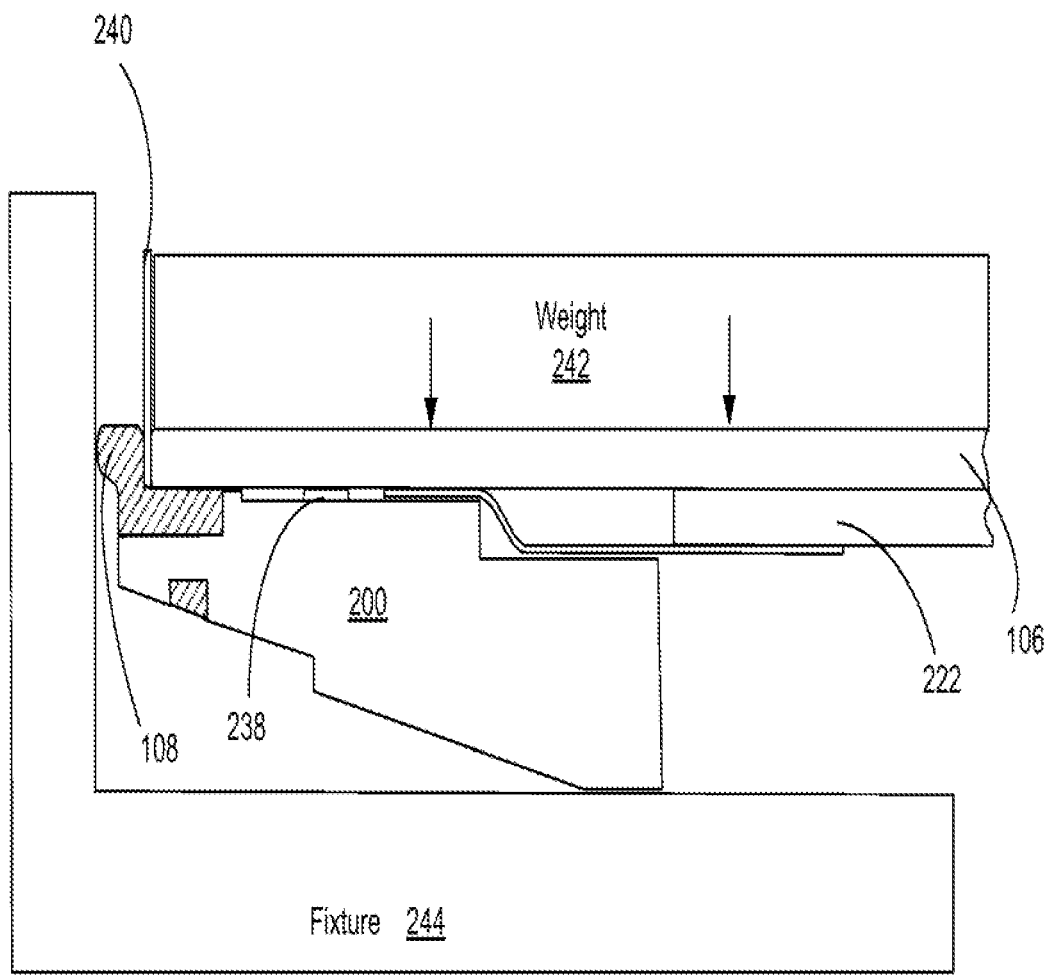
FIG. 9 shows a side view of a fixture assembly in accordance with the described embodiments.
Figure 10:
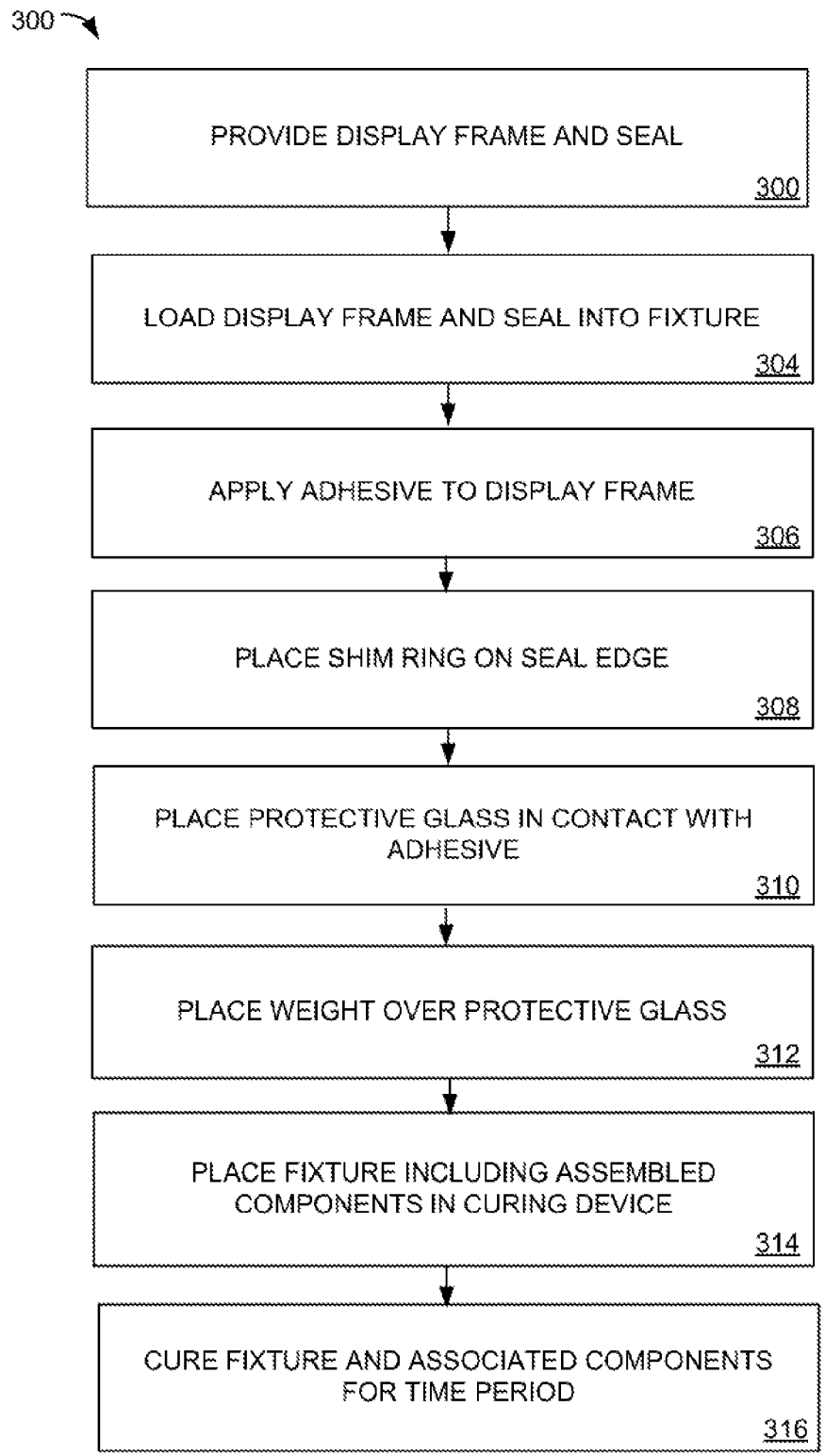
FIG. 10 is a flow chart of a method for assembling a display frame including securing a protective glass layer to the display frame.
Figure 11:
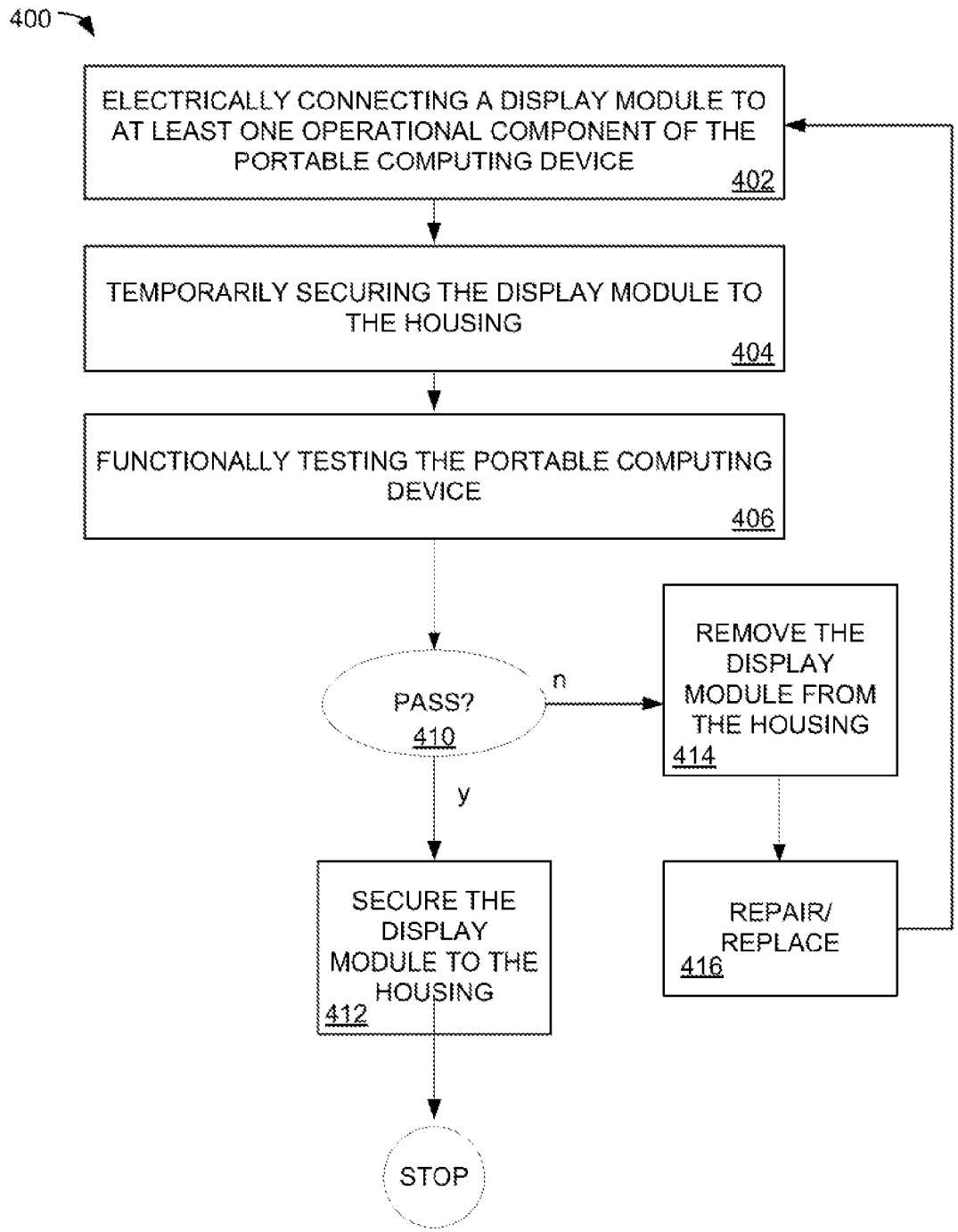
FIG. 11 is a flow chart of a method for integrating a display module into a portable computing device.

These and other embodiments are discussed below with reference to FIGS. 1-10. However, those skilled in the art will readily appreciate that the detailed description given herein with respect to these figures is for explanatory purposes only and should not be construed as limiting. In particular, with respect to FIGS. 1A and 1B, a portable computing device is described. In FIGS. 2-6, various stages of assembling display components associated with the portable computing device are described. In FIGS. 7A-7B, securing assembled display components to a portable computing device housing are discussed. In FIG. 8, an alternate coupling mechanism for securing the assembled display components to the portable computing device housing are discussed. In FIGS. 9 and 10, a fixture assembly and a method of using the fixture assembly to secure a protective top glass to a display frame and seal assembly are described. In FIG. 11, a method of assembling a portable computing device is described.

FIG. 1A illustrates a specific embodiment of portable computing device 100. More specifically, FIG. 1A shows a full top view of fully assembled portable computing device 100. Portable computing device 100 can process data and more particularly media data such as audio, video, images, etc. By way of example, portable computing device 100 can generally correspond to a device that can perform as a music player, game player, video player, personal digital assistant (PDA), tablet computer and/or the like. With regards to being handheld, portable computing device 100 can be held in one hand by a user while being operated by the user's other hand (i.e., no reference surface such as a desktop is needed). For example, the user can hold portable computing device 100 in one hand and operate portable computing device 100 with the other hand by, for example, operating a volume switch, a hold switch, or by providing inputs to a touch sensitive surface such as a display or pad.

Portable computing device 100 can include single piece seamless housing 102 that can be formed of any number of materials such as plastic or metal which can be forged, molded, or otherwise processed into a desired shape. In those cases where portable computing device 100 has a metal housing and incorporates RF based functionality, it may be advantageous to provide at least a portion of housing 102 in the form of radio (or RF) transparent materials such as ceramic, or plastic. In any case, housing 102 can be configured to at least partially enclose any suitable number of internal components associated with the portable computing device 100. For example, housing 102 can enclose and support internally various structural and electrical components (including integrated circuit chips and other circuitry) to provide computing operations for portable computing device. The integrated circuits can take the form of chips, chip sets, modules any of which can be surface mounted to a printed circuit board, or PCB, or other support structure. For example, a main logic board (MLB) can have integrated circuits mounted thereon that can include at least a microprocessor, semi-conductor (such as FLASH) memory, various support circuits and so on.

Housing 102 can include opening 104 for placing internal components and may be sized to accommodate a display assembly or system suitable for providing a user with at least visual content as for example via a display. In some cases, the display system can include touch sensitive capabilities providing the user with the ability to provide tactile inputs to portable computing device 100 using touch inputs. The display system can be formed of a number of layers including a topmost layer being a transparent protective layer 106 formed of polycarbonate or other appropriate plastic or highly polished glass. Using highly polished glass, protective layer 106 can take the form of cover glass 106 substantially filling opening 104. Seal 108 can be used to form a gasket between cover glass 106 and housing 102. Seal 108 can be formed of a resilient material such as a plastic along the lines of thermoplastic urethane or TPU. In this way, seal 108 can provide protection against environmental contaminants from entering the interior of portable computing device 100. Racetrack 110 can be defined as the uppermost portion of the housing 102 that surrounds cover glass layer 106. In order to maintain the desired aesthetic look and feel of portable computing device 100, it is desirable that any offsets between the housing 102 and cover glass 106 be minimized by centering racetrack 110.

Although not shown, the display panel underlying cover glass 106 can be used to display images using any suitable display technology, such as LCD, LED, OLED, electronic or e-inks, and so on. Display assembly may be placed and secured within the cavity using a variety of mechanisms. In one embodiment, the display system is snapped into the cavity. It may be placed flush with the adjacent portion of the housing. In this way, the display can present visual content that can include video, still images, as well as icons such as graphical user interface (GUI) that can provide information the user (e.g., text, objects, graphics) as well as receive user provided inputs. In some cases, displayed icons can be moved by a user to a more convenient location on the display. For example, GUI can be moved by the user manually dragging GUI from one location to a more convenient location. The display can also provide a user with tactile feedback provided by a number of haptic actuators usually, but not always, arranged in an array of haptic actuators incorporated into the display. In this way, the haptic actuators can provide the user with tactile feedback.

In some embodiments, a display mask (not shown) can be applied to, or incorporated within, or under cover glass 106. The display mask can be used to accent an unmasked portion of the display used to present visual content. The display mask can be used to make less obvious home button 112 used to provide a specific input such as change display mode, for example to portable computing device 100. The display mask can render home button 112 less obvious by, for example, being closer in tone or color to home button 112. For example, if home button 112 is formed of a material that is somewhat darker (such as gray or black) than cover glass 106, then using a similarly colored display mask can reduce the visual impact of home button 112 when compared with the unmasked portion of cover glass 106. In this way, the visual impact of home button 112 can be reduced by being integrated into the overall look of the display mask. Furthermore, the display mask can provide a natural mechanism for directing the attention of a viewer to the unmasked area of the display used to present visual content.

Portable computing device 100 can include a number of mechanical controls for controlling or otherwise modifying certain functions of portable computing device 100. For example, power switch 114 can be used to manually power on or power off portable computing device 100. Mute button 116 can be used to mute any audio output provided by portable computing device 100 whereas volume switch 118 can be used to increase/decrease volume of the audio output by portable computing device 100. It should be noted that each of the above described input mechanisms are typically disposed through an opening in housing 102 such that they can couple to internal components. In some embodiments, portable computing device 100 can include a camera module configured to provide still or video images. The placement may be widely varied and may include one or more locations including for example front and back of the device, i.e., one through the back housing, the other through the display window.

Portable computing device 100 can include a mechanism for wireless communications, as either a transceiver type device or receiver only, such as a radio, portable computing device 100 can include an antenna that can be disposed internal to a radio transparent portion of housing 102. In some embodiments, an antenna can be incorporated into seal 108 or cover glass 106. In other embodiments, a portion of housing 102 can be replaced with radio transparent material in the form of an antenna window described in more detail below. The radio transparent material can include, for example, plastic, ceramic, and so on. The wireless communications can be based on many different wireless protocols including for example 3G, 2G, Bluetooth, RF, 802.11, FM, AM, and so on. Any number of antennas may be used, which can use a single window or multiple windows depending on the needs of the system. In one embodiment, the system can include at least first and second antenna windows built into the housing (upper and logo).

Figure 1B:
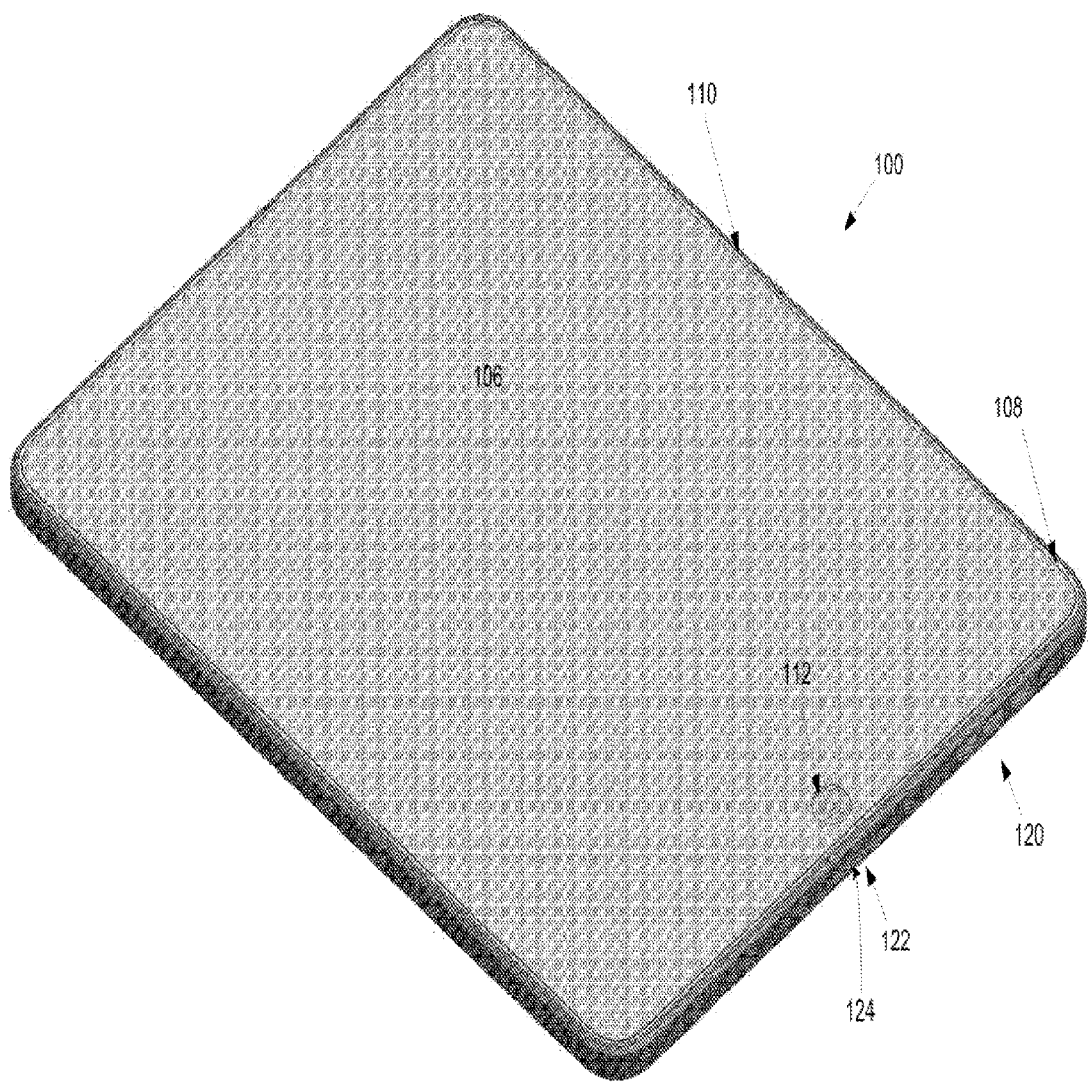
FIG. 1B shows a perspective top view of a portable computing device in accordance with the described embodiments.

FIG. 1B shows a perspective top view of portable computing device 100 in accordance with the described embodiments. As shown in FIG. 1B, portable computing device 100 can include one or more speakers 120 used to output audible sound. Portable computing device 100 can also include one or more connectors for transferring data and/or power to and from portable computing device 100. For example, portable computing device 100 can include multiple data ports, one for each configuration of portrait mode and landscape mode. However, the currently described embodiment includes single data port 122 that can be formed of connector assembly 124 accommodated within an opening formed along a first side of housing 102. In this way, portable computing device 100 can use data port 122 to communicate with external devices when portable computing device 100 is mounted in docking station. It should be noted that in some cases, portable computing device 100 can include an orientation sensor or an accelerometer that can sense the orientation or movement of portable computing device 100. The sensor can then provide an appropriate signal which will then cause portable computing device 100 to present visual content in an appropriate orientation.

Connector assembly 124 can be any size deemed appropriate such as, for example, a 30 pin connector. In some cases, the connector assembly 124 can serve as both a data and power port thus obviating the need for a separate power connector. Connector assembly 124 can be widely varied. In one embodiment, connector assembly 124 can take the form of a peripheral bus connector, such as a USB or FIREWIRE connector. These types of connectors include both power and data functionality, thereby allowing both power delivery and data communications to occur between the portable computing device 100 and the host device when the portable computing device 100 is connected to the host device. In some cases, the host device can provide power to the media portable computing device 100 that can be used to operate the portable computing device 100 and/or charge a battery included therein concurrently with the operating.

Figure 2:
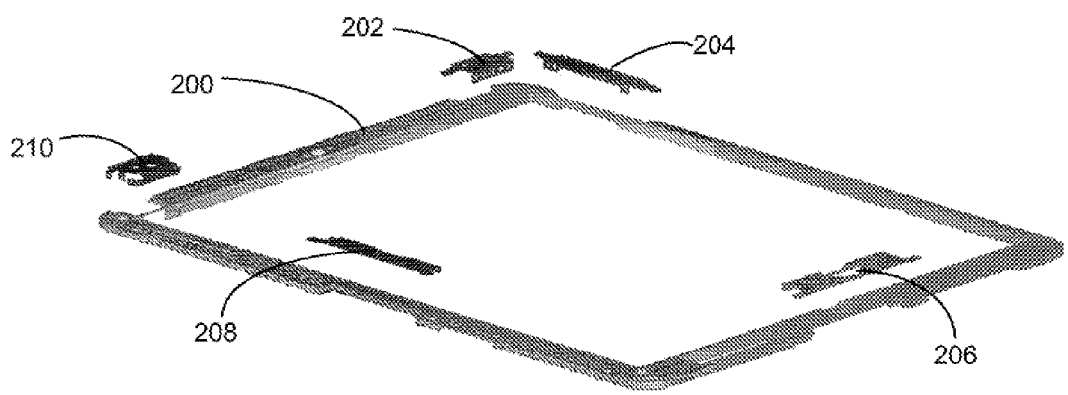
FIG. 2 shows a perspective top view of a display frame and inserts prior to assembly in accordance with the described embodiments.

FIG. 2 shows a perspective top view of a display frame 200 and inserts, 202, 204, 206, 208 and 210 prior to assembly. The display frame 200 can be formed from a material, such as a plastic or a metal. For instance, the display frame can be formed using thermoplastic urethane or TPU. The inserts can be used to provide additional structural support and reinforcement in regions where the display frame is proximate to openings in the housing 102 (see FIGS. 1A and 1B). For example, insert 202 is proximate to an opening for a mechanism switching power on or off, insert 204 is proximate to an opening for a mechanism that enables a muting function to be activated and a mechanism that enables volume control, insert 206 is proximate to an opening for multi-pin connector and insert 210 is proximate to an opening for an audio output interface, a microphone and a boot switch.

In particular embodiments, insert 208 can be eliminated. When insert 208 is included, it can provide structural support for an opening. The opening can be associated with a number of different functions. For instance, the opening can be used to provide audio output from an internal speaker, to insert or remove a Sim card, to provide external access to an external power and/or data pin connector, to provide support for a docking interface and to provide access to additional actuator, such as a switch or a button.

In general, the number, placement location and size of the inserts can be varied and is not limited to the example of FIG. 2. For example, in one embodiment, as described above, the opening and its associated insert 208 can be eliminated. In other embodiments, the opening for the muting and volume control mechanisms can be moved away from the corner resulting in changes to the display frame 200 and a change in a location of insert 204 to accommodate the different location of the opening. In another example, a size of insert 206 can be increased to accommodate multiple connectors, such as a separate power and data connectors.

Figure 3:
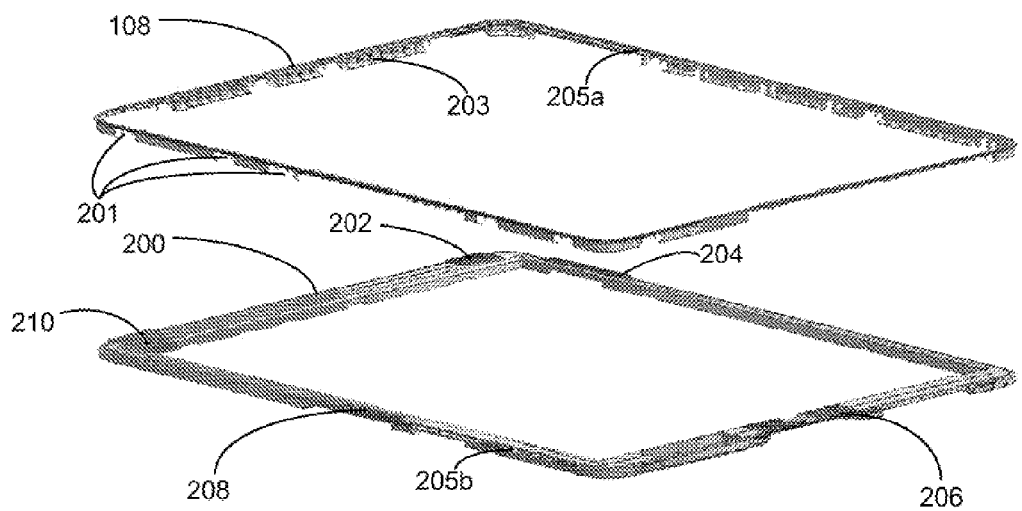
FIG. 3 shows a perspective top view of the display frame assembled with inserts and a seal frame prior to assembly in accordance with the described embodiments.

The inserts can be formed into an appropriate shape from a rigid material, such as a metal (e.g., stainless steel or magnesium). In one embodiment, the inserts can be formed from a polymer, such as IXEF™ manufactured by Solvay Advanced Polymers, LLC. As is shown in FIG. 3, the inserts can be incorporated into the display frame 200. In one embodiment, the inserts can be mechanically snapped into place. In another embodiment, an adhesive, such as an epoxy can be used to attach the inserts to the display frame.

In yet another embodiment, the inserts can be loaded into a plastic molding tool to form an integrated assembly, such as a plastic/metal assembly when metal inserts are used with a plastic display frame 200. After forming the display frame 200 and inserts, the inserts can incorporated into the display frame 200 and the combined assembly can be loaded into an over mold tool. The over mold tool can be used to apply an additional layer of plastic that bonds the inserts to the display frame 200. When the inserts are integrated into the display frame in this manner, a number of apertures can be designed into the inserts to improve adhesion between the insert material and the display frame material when additional plastic is added.

Figure 4:
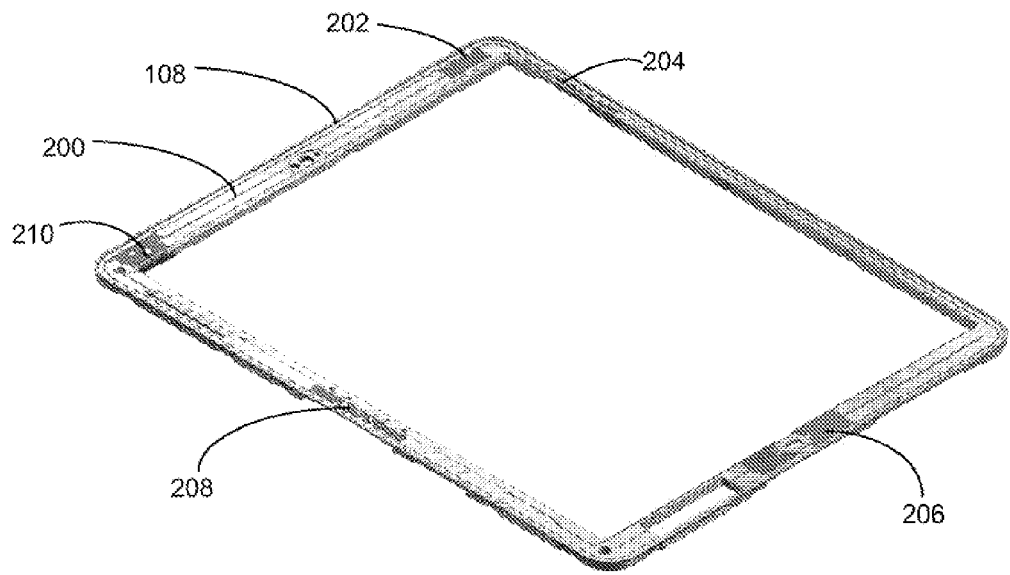
FIG. 4 shows a perspective top view of the display frame assembled with a seal frame in accordance with the described embodiments.

FIG. 3 shows a perspective top view of the display frame 200 assembled with inserts and a seal frame 108 prior to assembly in accordance with the described embodiments. FIG. 4 shows a perspective top view of the display frame 200 assembled with a seal frame 108 in accordance with the described embodiments. In one embodiment, the seal 108, when coupled to the display frame 200 (see FIG. 4), can rest on a ledge 205b around an outer perimeter of the display frame. The seal 108 can include a ledge 205a, around its perimeter, that rests on ledge 205b when the two components are seated against one another.

Figure 5:
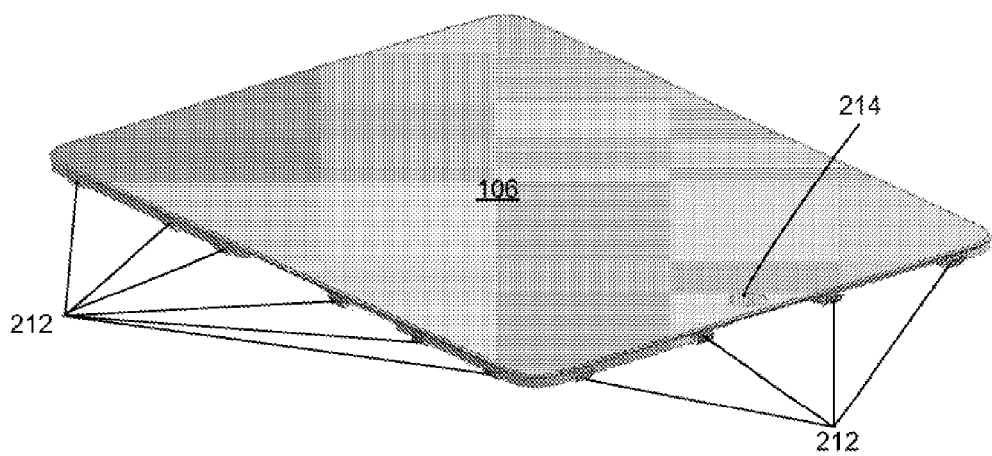
FIG. 5 shows a perspective top view of the display frame assembled with a seal, a protective top glass and mounting clips in accordance with the described embodiments.

In particular embodiments, the seal can include gaps, such as 201, that allow a component, such as a mounting tab (see FIGS. 5 and 6), secured to the display frame 200, to extend from the display frame 200. The seal 108 can also include gaps associated with openings in the housing 102 (e.g., see description of inserts with respect to FIGS. 2 and 3). The seal 108 can have parts, such as 203, that include posts and ledges that hang below a top surface of the seal. The posts can be aligned with indentations in the display 200 to form a conformal fit and prevent the seal from sliding relative to the display frame 200. When the seal 108 is coupled to the display frame 200 (see FIG. 4), the parts, such as 203, can extend underneath the display frame 200 (see FIG. 7 for a cross-sectional view). For example, portions of seal 108 can be located beneath ledge 205b on the display frame 200. In particular embodiments, the seal 108 can be coupled to the display frame using an adhesive, such as an epoxy, using a fastener, such as a screw, or combinations thereof In FIG. 4, the seal 108, display frame 200 and inserts are shown assembled. A protective top glass layer can be placed on top of the assembly. FIG. 5 shows a perspective top view of the display frame 200 assembled with a seal 108, a protective top glass 106 and mounting clips 212 in accordance with the described embodiments. The top glass 106 is mounted to the display frame 200, inserts and seal 108 as shown in FIG. 4. A method of mounting the top glass 106 to the display frame 200 is described with respect to FIGS. 9 and 10. The top glass 106 includes and aperture 214 for button 112 (see FIGS. 1A and 1B).

Mounting clips 212 are attached to the display frame 200. In one embodiment, the mounting clips 212 are coupled to the display frame 200 using a fastener, such as a screw. The mounting clips 212 can be used to secure the display components shown in FIG. 5 within housing 102. Details of the display components relative to the housing 102 and mounting clips 212 are described with respect to FIG. 7A.

Figure 6:
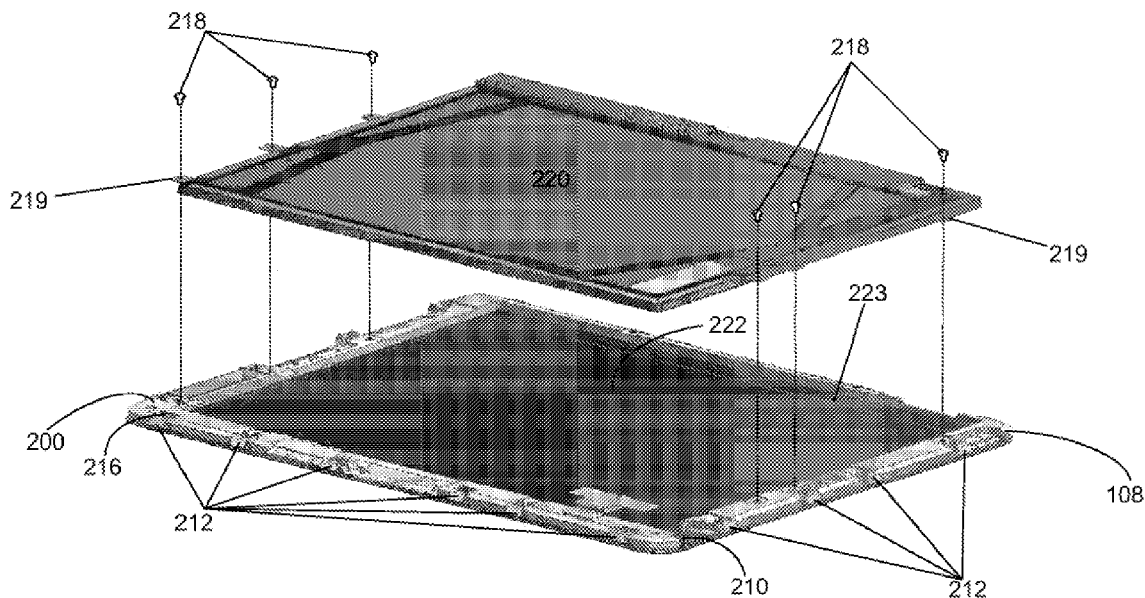
FIG. 6 shows a perspective bottom view of mounting a display panel housing to the protective top glass and frame assembly in accordance with the described embodiments.

FIG. 6 shows a perspective bottom view of mounting a display panel housing 220 to the protective top glass and frame assembly in accordance with the described embodiments. As is shown in FIG. 7, the display panel housing 220 can support and secure a display panel 224 and associated display circuitry 226. A touch screen 222 can be mounted below the protective top glass 106. As previously described, the mounting clips 212 can be secured to the display frame 200 via a fastener, such as 216.

As described in more detail with respect to FIG. 7A, when assembled, the display panel housing 220 hangs below display frame 200. The display panel housing 220 includes a number of mounting tabs with an aperture, such as 219. Fasteners 218 can be threaded through the apertures in the mounting tab and secured to corresponding mounting ports in the display frame 200. In one embodiment, the display panel 224 within the housing 220 can be attached to a bottom portion of touch screen 222 using an appropriate fixing agent, such as an epoxy or an adhesive tape. The display panel 224 can also be sealed to the back of the protective layer using a gasket, such as 223, that can be adhered to the display using an adhesive material.

In an impact invent, such as dropping the portable computing device, impact stresses can be distributed through out the portable computing device. During the impact invent, the stress loads experienced by each component can depend on the direction of the impact and how each component is coupled to one another. For example, the mounting tabs 219 couple to the display panel housing 220, display panel 224 and associated circuitry to the display frame 200. Depending on a number of mounting tabs that are used, the coupling between the display panel housing and display frame can be tighter or looser. Typically, the tighter the coupling between the two components, the more the two components tend to move as a single unit. Tighter coupling can be accomplished by using more mounting tabs, such as 219, between the display panel housing 220 and looser coupling can be accomplished by using relatively less mounting tabs.

In impact events, it was found that providing the display panel 224 with a greater capability for flexure reduced the likelihood of a stress crack forming in the display panel 224. In one embodiment, the display panel housing 220 is only coupled to the display frame 200 at the ends to provide more flexure. The display panel housing 220 is proximately rectangular and the mounting tabs are located on the shorter sides providing the greatest distance between mounting tabs on the two sides in which they are placed. Thus, during an impact invent, flexing can occur over a greater length and the stresses can be more spread out.

Also, it was found that placing the mounting tabs 219 in lower stress areas tended to reduce the likelihood of a stress crack forming in the panel during an impact event. A stress distribution for the display panel housing 220 and its associated components can be predicted for different impact invents to determine optimum locations to place the mounting tabs. In another embodiment, the mounting tabs, such as 219, can be located in areas that are predicted to have lower stresses than other areas, such that less stress is transferred to the display panel housing 220 from the display frame 200. Further, a total number of mounting tabs can be reduced to decrease the coupling between the display frame 200 and the display panel housing 220. For instance, no mounting tabs are found on two of the sides of the display panel housing 220 and a number mounting tabs on the other sides can be reduced, such as the three mounting tabs 219 shown on each side in FIG. 6.

FIG. 7A shows a cross sectional view of a portable computing device with a display module 225 including the display frame 200 and display panel 224 in an assembled position within the housing 102. The display module 225 is assembled from the components shown in FIG. 6. The display panel housing 220 includes a frame or one or more brackets that secure the display panel 224 and the display circuitry 226. The seal 108 on the display frame is in contact with a lip 228 of the housing 102. In an assembled position, when the device 100 is facing upwards, i.e., the protective top glass 106 is facing upwards, the display panel housing 220 and its associated display components are suspended or hang down from the display frame 200.

To install the display module 225 into the housing 102. The mounting clips 212 which are distributed around the perimeter of the display frame 200 (e.g., see FIGS. 5 and 6) are compressed towards the display frame 200 allowing the mounting tabs 212 to move past the lip of the housing 220. Once a tip of the mounting clip 212 clears the lip 228, the mounting tab can expand outward underneath the lip 228 and into a notch 227 in the display housing 102. In the expanded position, the mounting clips, such as 212, can prevent the display frame 200 and its associated components from being removed from the housing 102. More details of installing the display module 225 into the housing are described with respect to FIG. 7B.

In particular embodiment, the notch can be formed by removing a rectangular portion of housing 102. The width of the notch can be wider than the width of clip 212 to accommodate the clip 212. A number of the notches can be formed around the perimeter of housing 220 to accommodate each of the clips 212. The number of clips can be varied and hence the number of notches formed in the housing can be varied between designs.

Compressive forces, such as 229, can be used to keep the protective top glass, flush with the top of housing. These forces can be applied to the display frame 200 or other components coupled to the display frame 200, such as the display panel housing 220. The forces, such as 229, can be applied at a number of locations throughout the device 100 and are not limited to the location indicated by 229. As an example, in some locations, the display frame 200 or its associated components can be in contact with foam or another material, such as a high-strength foam, that is in compression. The material can be placed in compression when the display frame 200 is inserted into the housing 102.

The compressed material can apply a compressive force upwards to the display frame 200. The compressive force can cause the mounting clips, such as 212, to move or spread outwards, i.e., towards the housing 102. In another embodiment, one or more springs (not shown) can be used to provide a compressive force directly to the display frame 200 or the forces can be provided through one or more intermediary components linked to the display frame 200. For instance, a spring can be located under a component that is under the display frame 200. The spring can be oriented to press upwards against the component and towards the display frame 200. The component can be in contact with display frame 200 to transfer a compressive force from the spring to the display frame 200 via the component.

During a drop event, the seal 108 and/or the mounting clips, such as 212, can allow some lateral movement and provide some force dampening. For instance, when a force is applied in the direction 231, the seal 108 and possibly one or more of the mounting clips, such as 212 can be compressed absorbing a portion of the force. One or more of the mounting clips on a side opposite (not shown) can expand or stretch outward, i.e., lengthen. The expansion of the mounting clips outward on the opposite side can keep the display assembly in place. After the seal 108 and/or mounting clip 212 uncompress, the display frame can move in the opposite direction of force 231. This type of interaction involving a compression and subsequent expansion of the seal 108 and movements of the mounting clip can occur for any resultant forces that are parallel to top surface of the protective glass 106, such as a resultant force in the opposite direction of 231 or a resultant force perpendicular to 231 (i.e., into the page).

FIG. 7B shows a cross sectional view of a portable computing device 100 with a display module 225 in a pre-assembled position in accordance with the described embodiments. During installation of the display module 225 to the housing 102 shims, such as 241, can be inserted between the housing 102 and the mounting clips. The shims, such as 241, hold the mounting clip in a compressed position 212a. In one embodiment, a number of shims can be used, such as one shim for each clip. In other embodiments, a single shim can be used for multiple mounting clips. For example, a single shim can be used to compress all of the mounting clips on a side of the display module 225. In yet another embodiment, a shim tool that follows the inner perimeter of housing 102 near the lip 228 can be used to compress all of the shims at one time. The shim tool can be removed as a single piece to allow the mounting clips to engage.

The display module 225 can be connected to the electrical components within the portable device and the display module 225 can be tested prior to removing the shims, such as 241, that allow the mounting clips, such as 212a to engage. Besides the display module 225, other electrical internal electrical components such as a main logic board can be also tested since one the display module 225 is installed direct access to many of the internal components is no longer possible. Once it is determined that display module and/or electrical components are operating acceptably, the shims can be removed. A testing method is described in further detail with respect to FIG. 11.

After the shims are removed and mounting clips expand into place, the display module 225 and other internal components can be re-tested. If it is determined that there is a malfunction, it may be necessary to remove the display module 225 from the housing 102. An upward force can be applied pull the display module 225 away from the housing. In one embodiment, the upward force can be applied using a device, such as a suction cup 243.

In a particular embodiment, the upward force on the display module can be applied until one or more of the mounting clips break. For example, the upward force can be applied on one corner of the display module and then the mounting clips can be broken in a zipper like fashion, i.e., one at a time. When enough of the mounting clips are broken (it may not be necessary to break all of the mounting clips to remove the display module 225), the display module 225 can removed from the housing. After the display module 225 is removed, broken clip portions can be removed from the interior of the housing 102 and needed repairs can be determined. If the display module 225 is functioning properly, new mounting clips can be installed in the display module 225 and the display module 225 can be reinstalled. In some embodiments, it may be possible to remove the display module 225 without breaking the mounting clips. One such example is described as follows with respect to FIG. 8.

FIG. 8 shows side views of a mounting mechanism 232 in accordance with the described embodiments. The mounting mechanism 232 includes three track portions, such as 231 in contact with and configured to move along a track 234. Two bump portions, such as 210, are located between the three track portions. The mounting mechanism can be a sheet, such as a metal sheet with some width and some thickness. The sheet can be bent or shaped to form 232 or some shape proximate to the 232. The mounting mechanism is shown in an unloaded configuration, 230a and a loaded configuration, 230b.

The mounting mechanism can be configured such that when a force, such as 236, is applied and the mounting mechanism is loaded, the bump portions flatten and the mounting mechanism lengthens. The lengthening of the mounting mechanism causes the end track portions to move outwards and slide along track 234. After the mounting mechanism 232 is unloaded, it can be designed to return to its unloaded configuration, 230a, where the height of the bumps increases and the end track portions move inward to allow the mounting mechanism to shorten.

In one embodiment, the mounting mechanism 232 can be used as alternate to the mounting clips, such as 212, or can be used in conjunction with the mounting clips, such as 212 (see FIGS. 7A and 7B). The mounting mechanism 232 can be located on a side of the display frame 200 like mounting clip, 212. Referring to FIG. 7B, in an unloaded position, prior to installing the display module 225, the mounting mechanism 232 can stick out past the housing lip 228. A load can be applied to the mounting mechanism 232 to flatten it and allow the display module 225 to slide past the lip 228.

After the lip 228 is cleared, the load can be removed from the mounting mechanism. The mounting mechanism 232 can then expand to lock the display module 225 into place. For instance, the mounting mechanism 232 could sit in notch 227 when expanded. The notch 227, in this example, can also be a slot to accommodate both bumps of the mounting mechanism 232 rather than forming separate notches for each bump.

The display module 225 can be removed after it has been installed in housing 102. Using mounting mechanisms, such as 232, the display module 225 can be removed by inserting a thin strip, such as a thin metal blade, between the seal 108 and the lip 228. The thin strip can be inserted between the bumps of the mounting mechanism 232. The thin strip can be slid over to one side or the other to load and flatten one of the bumps of the mounting mechanism, which flattens the other bump. When the mounting mechanism is flattened, it may be possible to lift the display module 225 such that the mounting mechanism slides by the lip 228 of the housing allowing the display frame to be removed without breaking the mounting mechanism 232.

As previously described with respect to FIG. 7B, using clips 212, the display module 225 can be removed by lifting the display frame and breaking mounting clips, such as 212. For instance, suction cups can be applied to the top of protective glass 106 to lift out the display module 225. To re-install the display module 225, new mounting clips can be attached. One advantage of mounting mechanism 232 is that it may be possible to remove the display module 225 without breaking mounting mechanism 232.

FIG. 9 shows a side view of a fixture assembly 244. With respect to FIG. 9, a method of assembly is described that can be used to provide an even spacing around the perimeter of the protective top glass 106 between the protective top glass 106 and seal 108. The fixture 244 can be used to secure the display frame 200 such that a surface that supports the protective top glass 106 is in a horizontal position. In one embodiment, the protective top glass can be seated on a portion of the seal 108 and a portion of the frame 200 as is shown.

An adhesive, such as 238, can be applied to the display frame 200. For instance, a line of liquid epoxy can be applied around the display frame 200 as an adhesive. Next, a shim ring 240 can be placed in contact with an inner surface perimeter of the seal 108 (The shim ring is configured to conform to the inner perimeter of the seal 108, which is proximately rectangular.) Then, the protective top glass layer can be placed between the shim ring and in contact with the adhesive 238.

A weight, such as 242 can be placed on top of the protective glass layer 106. In one embodiment, the weight can be held in place by the shim ring 240. The weight 242 can be used to keep the protective top glass 106 horizontal while the adhesive is curing. Finally, in one embodiment, the fixture 244 and its content can be placed in an oven to aid in curing of the adhesive 238. In one embodiment, a curing time can be about ½ hour.

FIG. 10 is a flow chart of a method 300 for assembling a display frame, such as 200, including securing a protective glass layer, such as 106, to the display frame. In 302, a display frame including a seal as described with respect to FIG. 4 can be provided. Providing the display frame can involve forming a plastic display frame and inserts for structural reinforcement, loading the inserts into the display frame, adding a plastic layer over the inserts to bond the inserts to the display frame and bonding the seal 108 to the display frame including the inserts, as was previously described. In 304, a display frame and seal can be loaded into a fixture assembly as described with respect to FIG. 9. In 306, an adhesive can be applied to the display frame secured in the fixture assembly.

In 308, a shim ring can be placed proximate to an inner edge of the seal on the display frame 200. In 310, the protective glass can be placed within the shim ring and in contact with the adhesive. In 312, a weight can be placed over the protective glass. In 314, the fixture assembly with the display frame can be placed in a curing device, such as an oven. In 316, the fixture assembly and the associated components can be placed in the curing device for some time period to allow the bond between the protective top glass and the adhesive to form. Then, the fixture assembly can be removed from the oven, the weight and the shim ring can be removed and the display frame with the bonded protective top glass can be removed from the fixture assembly.

FIG. 11 is a flow chart of a method 400 for integrating a display module into a portable computing device. In 402, the display module can be electrically connected to at least one operational component of the portable computing device. In 404, the display module can be temporarily secured to the portable device housing (see FIG. 7B). In 406, the portable computing device can be functionally tested. In 410, a determination can be made in regards to whether the device has passed a testing regimen. When the device passes the testing regimen, in 412, the display module can be secured to the housing (see FIG. 7A).

When the device does not pass the test regimen, in 414, the display module can be disconnected and removed from the housing. Since the mounting clips have not been engaged yet, the display module can be removed without breaking the mounting clips. In 416, necessary repairs for the portable device can be determined and components can be replaced as needed. Then, the method can be repeated starting with 402.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, DVDs, magnetic tape, optical data storage devices, and carrier waves. The computer readable medium can also be distributed over network-coupled computer systems so that the computer readable code is stored and executed in a distributed fashion.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

While the embodiments have been described in terms of several particular embodiments, there are alterations, permutations, and equivalents, which fall within the scope of these general concepts. It should also be noted that there are many alternative ways of implementing the methods and apparatuses of the present embodiments. For example, although an extrusion process is preferred method of manufacturing the integral tube, it should be noted that this is not a limitation and that other manufacturing methods can be used (e.g., injection molding). It is therefore intended that the following appended claims be interpreted as including all such alterations, permutations, and equivalents as fall within the true spirit and scope of the described embodiments.

What is claimed is:

1. An electronic device, comprising:
   a single piece housing with a bottom wall and side walls, wherein the bottom wall and side walls define a front opening of the electronic device;
   a display module in the front opening that is secured to the single piece housing, wherein the display module comprises:
   a display frame;
   a display panel supported by the display frame;
   a cover supported by the display frame; and
   a plurality of attachment features that secure the display module to the single piece housing without using a bezel.

2. The electronic device defined in claim 1, wherein the plurality of attachment features comprises mounting clips.

3. The electronic device defined in claim 2, wherein each mounting clip comprises a first portion that is substantially parallel to a surface of the display frame.

4. The electronic device defined in claim 3, wherein the first portion of each mounting clip is directly adjacent to the display frame, and wherein each mounting clip is secured to the display frame by a respective fastener.

5. The electronic device defined in claim 4, wherein each mounting clip comprises a second portion that protrudes into a respective recess in the single piece housing.

6. The electronic device defined in claim 1, further comprising a seal interposed between the side walls and the cover.

7. The electronic device defined in claim 6, further comprising an antenna incorporated into the seal.

8. The electronic device defined in claim 6, wherein the seal has a portion that extends beneath the cover.

9. An electronic device, comprising:
   a single piece housing with a top opening and a lip portion surrounding the top opening;
   a cover that is positioned above a display module, wherein the display module is positioned in the top opening and comprises:
   a display panel;
   display circuitry attached to the display panel;
   a display panel housing that attaches the display circuitry to the display panel; and
   a frame that supports the display panel housing, wherein the display panel housing is suspended from the frame.

10. The electronic device defined in claim 9, further comprising at least one mounting clip that secures the frame to the single piece housing.

11. The electronic device in claim 9, wherein the electronic device is a tablet computer.

12. The electronic device defined in claim 9, further comprising a seal in contact with the lip portion and the cover.

13. The electronic device defined in claim 12, wherein the seal has a portion that is interposed between and in contact with the frame and the cover.

14. The electronic device defined in claim 9, further comprising a plurality of inserts used to provide additional structural support and reinforcement in portions of the frame.

15. An electronic device, comprising:
   a housing with a bottom wall and side walls, wherein the bottom wall and side walls define a front opening of the electronic device, and wherein the side walls comprise a recess;
   a display module in the front opening wherein the display module comprises a display frame;
   a transparent cover layer that is supported by the display frame;
   a seal interposed between the side walls and the transparent cover layer; and
   at least one mounting clip having a first portion that is attached to the display frame and a second portion that extends into the recess.

16. The electronic device defined in claim 15, wherein the seal has a portion that extends underneath the transparent cover layer.

17. The electronic device defined in claim 16, wherein the portion is interposed between the transparent cover layer and the display frame.

18. The electronic device defined in claim 15, wherein the portion is coupled to the display frame using an adhesive.

19. The electronic device defined in claim 15, wherein the display module is configured to move relative to the housing during an impact event.

20. The electronic device defined in claim 15, wherein the seal comprises a plastic.

* * * * *